United States Patent [19]

Wakabayashi et al.

[11] Patent Number: 4,688,077
[45] Date of Patent: Aug. 18, 1987

[54] SEMICONDUCTOR DEVICE HAVING RADIATOR

[75] Inventors: Tetsushi Wakabayashi, Yokohama; Masahiro Sugimoto, Yokosuka; Kiyoshi Muratake, Kawasaki, all of Japan

[73] Assignee: Fujitsu Limited, Kawasaki, Japan

[21] Appl. No.: 822,964

[22] Filed: Jan. 28, 1986

Related U.S. Application Data

[63] Continuation of Ser. No. 479,435, Mar. 28, 1983, abandoned.

[30] Foreign Application Priority Data

Mar. 29, 1982 [JP] Japan .................................. 57-50733

[51] Int. Cl.[4] ............................................ H01L 23/02
[52] U.S. Cl. ........................................ 357/81; 357/74
[58] Field of Search ............................ 357/81, 82, 74; 361/382, 383, 384, 389

[56] References Cited

U.S. PATENT DOCUMENTS

| | | | |
|---|---|---|---|
| 2,994,017 | 7/1961 | Kadelburg | 357/81 |
| 3,457,988 | 7/1969 | Meyerhoff et al. | 357/81 |
| 4,292,647 | 9/1981 | Lee | 357/81 |
| 4,340,902 | 7/1982 | Honda et al. | 357/74 |

FOREIGN PATENT DOCUMENTS

| | | | |
|---|---|---|---|
| 0035390 | 9/1981 | European Pat. Off. | |
| 0054597 | 6/1982 | European Pat. Off. | 361/392 |
| 0079238 | 5/1983 | European Pat. Off. | 357/81 |
| 0126276 | 11/1978 | Japan | 357/81 |
| 0061049 | 5/1980 | Japan | 357/81 C |
| 0122149 | 9/1981 | Japan | 357/81 |
| 0878100 | 9/1961 | United Kingdom | 357/81 C |

OTHER PUBLICATIONS

*IBM Technical Disclosure Bulletin*, "Heat Conductor Module", Hwaug et al., vol. 21, No. 1, p. 138, (6/1978).
IBM Technical Disclosure Bulletin, vol. 23, No. 9, Feb. 1981, pp. 4222–4223, Nutter et al., "Center Post Heat Sink".

Primary Examiner—James W. Davie
Attorney, Agent, or Firm—Staas & Halsey

[57] ABSTRACT

A semiconductor device having a semiconductor package and a radiator. The semiconductor package houses a semiconductor chip therein. The radiator includes a pillar which has a plurality of fins thereon. One end of the pillar is bonded to the semiconductor package. A hole is formed in the other end of the pillar and extends the longitudinal direction of the pillar.

12 Claims, 5 Drawing Figures

SEMICONDUCTOR DEVICE HAVING RADIATOR

This is a continuation of co-pending application Ser. No. 479,435 filed on Mar. 28, 1983, now abandoned.

BACKGROUND OF THE INVENTION

The present invention relates to a semiconductor device. More particularly, it relates to an improved radiator for cooling a semiconductor chip which generates a large amount of heat.

A radiator is attached to a semiconductor integrated-circuit (IC) package which houses an IC chip which generates a large amount of heat. Such a radiator comprises a pillar and a plurality of fins disposed on the pillar. The pillar is secured to a molded plastic body or a ceramic body which houses the IC chip. The size of the fins corresponds to the size of the IC package and is not uniform. A number of semiconductor devices, each of which comprises an IC package and a radiator, are densely mounted on a printed circuit board. It is inconvenient to handle such small-sized semiconductor devices, and it is also difficult to place the ICS in a predetermined position when mounting them on a printed board. In addition, it is troublesome to remove the semiconductor devices from the printed board if it is necessary to replace them. Furthermore, it is difficult to distinguish one kind of semiconductor device from another when a number of different kinds of semiconductor devices are to be mounted on the printed board since semiconductor devices are all virtually the same size. To facilitate handling of the semiconductor devices which are densely mounted on the printed board, a projection is to be formed on the uppermost fin of the radiator for picking up the semiconductor device. The uppermost fin is removed to make it possible to access to the pillar for picking up the semiconductor device. It is not desirable, however, to form such a projection since the height of the semiconductor device is increased thereby hindering the semiconductor device from being mounted on a printed board which has small space above the upper surface thereof. Removing the uppermost fin is also undesirable since the efficiency of radiation of heat is degraded.

SUMMARY OF THE INVENTION

The present invention takes the above-mentioned problems into consideration. An object of the present invention is to provide a semiconductor device having a radiator which aids handling and thereby renders the positioning and replacement of the device easy without degrading the efficiency of the radiation of heat.

A semiconductor device having a radiator according to the present invention includes: a semiconductor package which houses a semiconductor chip therein; and a radiator comprising a pillar and a plurality of fins thereon. One end of the pillar is bonded to the semiconductor package, and the other end of the pillar has a first hole. The first hole extends into said pillar along the longitudinal direction of the pillar.

DESCRIPTION OF THE PREFERRED EMBODIMENTS

Figure 1:
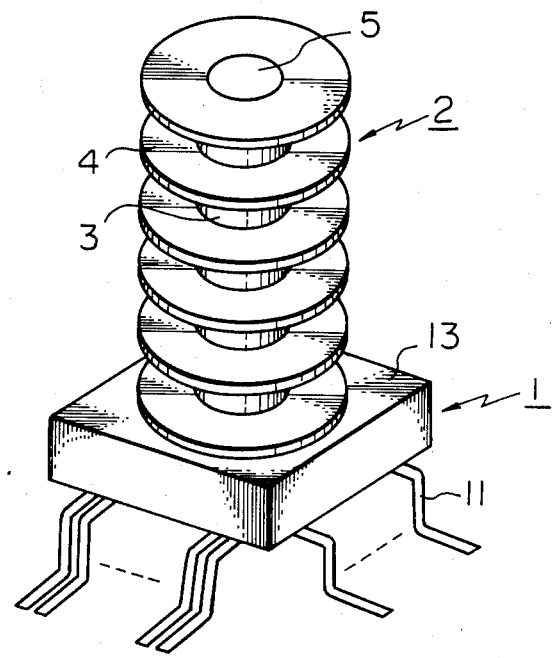
FIG. 1 is an example of the semiconductor device according to the present invention.
Figure 2:
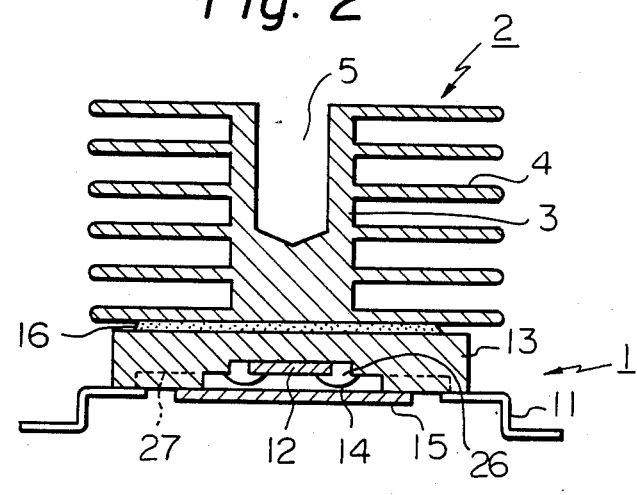
FIG. 2 is the semiconductor device according to the present invention.
Figure 4:
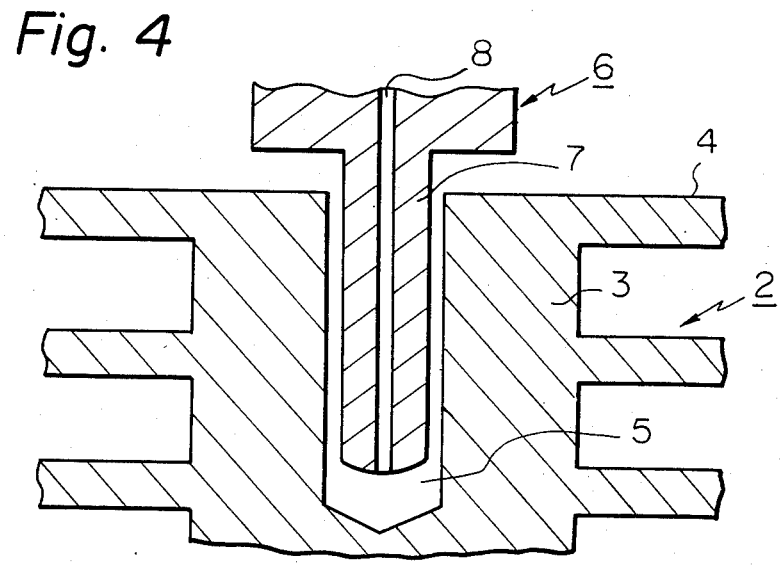
FIG. 4 is the semiconductor device according to the present invention.

A semiconductor device according to the present invention comprises a semiconductor package 1 and a radiator 2, as illustrated in FIG. 1. The semiconductor package 1 comprises a base body 13 and lead terminals 11. A semiconductor chip 12 is housed within a cavity 26 of the base body 13 and is covered by a cap 15 as is shown in FIG. 2. The semiconductor chip 12 is connected to printed circuit patterns 27 formed within the base body 13 by wires 14. The radiator 2 comprises a cylindrical pillar 3 with a plurality of fins 4 thereon. The lower end of the pillar 3 is bonded to the base body 13 of the semiconductor package 1 with an adhesive agent 16, such as epoxy resin. A first hole 5 is formed in the upper end of the pillar 3 and extends along the longitudinal direction of the pillar 3. The pillar 3 and the fins 4 are made of aluminium, copper, molybdenum, or the like. A vacuum chuck 6, illustrated in FIG. 4, is used to handle the semiconductor device.

Figure 3:
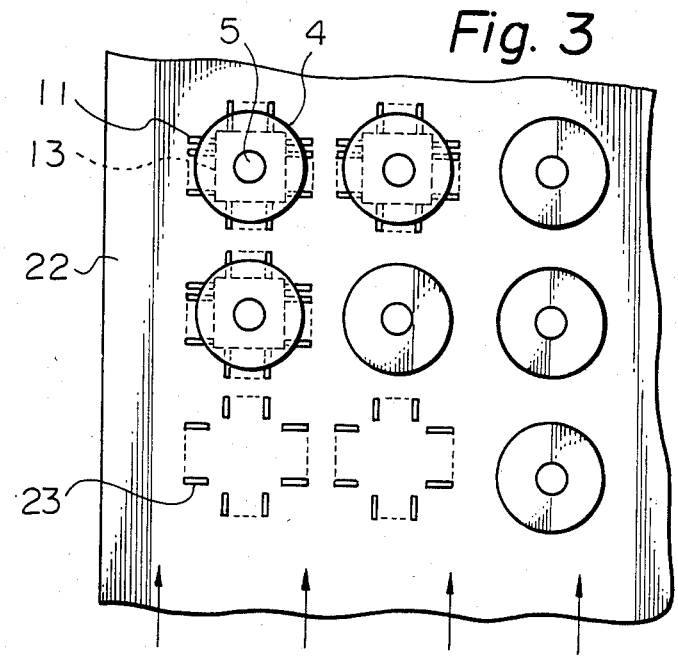
FIG. 3 is a plan view of a printed board on which semiconductor devices of the present invention are mounted.

An access end 7 of the vacuum chuck 6 is inserted into the hole 5. Vacuum is applied through a vacuum passage 8 so that the semiconductor device is sucked and held by the vacuum chuck 6. The semiconductor device sucked and held by the vacuum chuck 6 is picked up and is conveyed to, for example, a printed circuit board 22, illustrated in FIG. 3. The semiconductor device is placed on pad patterns 23 by aligning each lead terminal 11 with a corresponding pad pattern 23. The lead terminals 11 are then soldered to the pad patterns 23. The semiconductor device can be automatically conveyed to and placed in a predetermined position by an automatic positioning machine provided with a vacuum chuck. For manual placement the diameter of the fins 4 should be large enough to cover the base body 13 of the semiconductor package but small enough so that the ends of the lead terminals on opposite sides of the base body 13 are not observed when viewed from above. Positioning of the semiconductor device is therefore easy since the operator can see the lead terminals 11 and the pad patterns 23. When an automatic positioning machine is used, the diameter of the fins 4 may be increased thereby enhancing the efficiency of heat radiation to a degree. However, the fins of the adjacent semiconductor devices do not contact each other. Cooling air is supplied, as is illustrated by the arrows in FIG. 3, to the printed board 22, on which a number of semiconductor devices are mounted. Disc-shaped fins are desirable because they decrease resistance to the flow of cooling air. Disc-shaped fins are also desirable from the viewpoint of production.

A tweezers shaped instrument which has obliquely crossed ends may be used instead of a vacuum chuck to pick up the semiconductor device. The ends of the tweezer-shaped instrument are inserted into the hole 5 of the radiator 2. Then the inserted ends of the instrument are opened by hand or by an appropriate spring means to push against the inside surface of the hole 5 so that the semiconductor device can be picked up by the instrument.

It is preferable to form the hole 5 in such a manner that one type of IC package can be distinguished from another. This can be accomplished by varying the depth of the hole 5. If this is done, the type of IC package can be distinguished by the inserted length of the vacuum chuck or by measuring the depth of the hole 5 with an appropriate instrument. Not only does this make it easy for an operator to distinguish an IC package, it also makes possible automatic distinguishing of an IC package.

Figure 5:
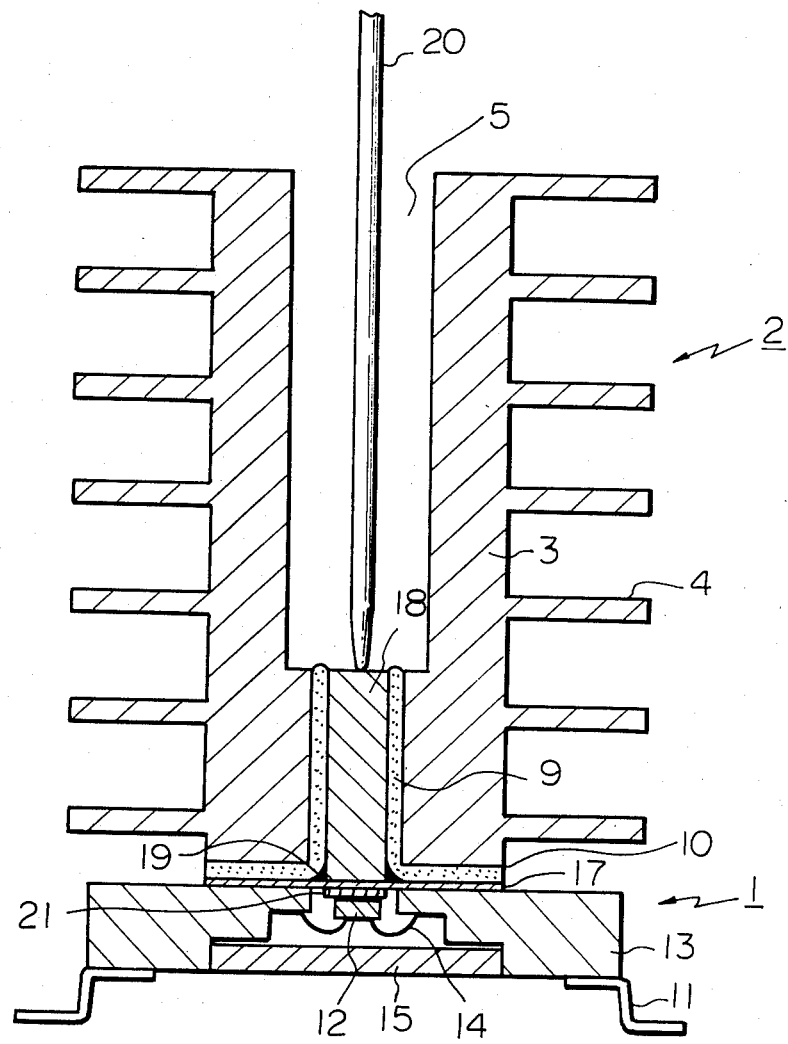
FIG. 5 is another example of the semiconductor device according to the present invention.

Another embodiment of the present invention is sectionally illustrated in FIG. 5. A metal plate 17 of molybdenum is disposed on the upper surface of the IC package 1. A metal stud 18 is bonded onto the metal plate 17 with a soldering agent 19. The IC chip 12 is attached to the metal plate 17 through a metal base 21. Therefore, the back surface of the IC chip 12 is electrically connected to the stud 18. A first hole 5 is formed in the upper end of the pillar 3 of the radiator 2. A second hole 9, small in diameter and corresponding to the diameter of the stud 18, is formed in the lower portion of the pillar 3 in series with the hole 5. The radiator 2 is attached to the IC package 1 by inserting the stud 18 into the secnd hole 9 of the radiator 2 and bonding it to the IC package with an adhesive agent 10.

This construction makes the hole 5 convenient not only for picking up the semiconductor device but also for inserting a probe 20 into it to make electrical contact with the IC chip 12 through the stud 18. The function of the IC chip 12 can be easily tested since power can be supplied to the IC chip 12 through the probe 20 instead of through the one of the lead terminals 11.

The inventors performed an experiment which confirmed that the hole 5 and the second hole 9 do not affect the efficiency of heat radiation of the radiator. The reason for this is that amount of heat radiated from the upper portion of the pillar is small relative to the amount of heat radiated by the fins provided on the lower portion of the pillar. That is, amount of heat conducted through the upper portion of the pillar is small while amount of heat conducted through the pillar near the bonding portion between the pillar 3 and the base body 13 is large. Therefore, the efficiency of heat radiation of the radiator provided with a hole in the upper portion of the pillar is not degraded when compared with a radiator without such a hole.

The type of IC package is not limited to a flat package in which lead terminals are soldered onto the surface of the printed board. Any type of IC package, such as a package in which lead terminals are inserted into holes in the printed board, may be used. In addition, the radiator may be used in conjunction with other semiconductor devices.

As mentioned above, a radiator according to the present invention makes it possible to easily handle the semiconductor device and to easily distinguish each IC package. With the semiconductor device of the present invention, an IC package can be easily and precisely placed in a predetermined position. In addition, an IC package can be automatically positioned. This is especially advantageous when a number of semiconductor devices are to be densely mounted on a printed board.

We claim:

1. A semiconductor device including a semiconductor chip for mounting on a base plate, comprising:
   a semiconductor package, for housing the semiconductor chip, having a width and having first and second main surfaces on opposite sides of the package from each other, the first main surface having a plurality of lead terminals extending a predetermined distance from the semiconductor package in the direction of said width and being in confronting relationship with the base plate, and the second main surface facing away from the base plate; and
   a radiator having a pillar and a plurality of disc-shaped fins extending from said pillar, a bottom end of said pillar being bonded to the second main surface of said semiconductor package, a top end of said pillar having a first hole for insertion of a handling instrument for transportation of said semiconductor package, said first hole extending into said pillar along a longitudinal direction of said pillar and opening away from the semiconductor package and the base plate, the radius of each disk-shaped fin being larger than half the width of said package and smaller than half the width of said semiconductor package plus the predetermined distance.

2. A semiconductor device having a radiator as set forth in claim 1, said device further comprising:
   a stud mounted on said semiconductor package, said pillar having a second hole for inserting said stud; and
   an adhesive agent for attaching said radiator to said semiconductor package by inserting said stud into said second hole and securing it therein with said adhesive agent.

3. A semiconductor device having a radiator as set forth in claim 2, wherein said second hole is formed in series with said first hole formed in said end opposite to said end which is bonded to said semiconductor package.

4. A radiator bondable to a semiconductor package containing a semiconductor chip, the semiconductor package having a width, having external leads extending a predetermined distance from the semiconductor package in the direction of the width, and being mounted on a base plate, comprising:
   a pillar having a plurality of fins extending from said pillar, a bottom end of said pillar being bondable to said semiconductor package, a top end of said pillar having a first hole for insertion of a handling instrument for transportation of said semiconductor package, the first hole extending into said pillar along a longitudinal direction of said pillar and opening away from the base plate, said fins having a diameter greater than half of the width of the semiconductor package and less than half of the width of the semiconductor package plus the predetermined distance.

5. A radiator as set forth in claim 4, wherein said pillar has a second hole in the bottom end, the second hole being in series with the first hole.

6. A radiator as set forth in claim 5, further comprising:
   a metal base in electrical contact with the semiconductor chip;
   a metal plate disposable on the upper surface of the semiconductor package and in contact with said metal base;
   a metal stud bonded to said metal plate; and
   an adhesive agent for attaching said radiator to said stud by inserting said stud into the second hole and securing it therein with said adhesive agent.

7. A semiconductor device including a semiconductor chip for mounting on a base plate, comprising:

a semiconductor package, for housing the semiconductor chip, having a width and having first and second main surfaces on opposite sides of the package from each other, the first main surface having a plurality of lead terminals extending a predetermined distance from the semiconductor package in the direction of said width and being in confronting relationship with the base plate, and the second main surface facing away from the base plate; and a radiator having a pillar and a plurality of disc-shaped fins extending from said pillar, a bottom end of said pillar being bonded to the second main surface of said semiconductor package, a top end of said pillar having a first hole for insertion of a probe for testing said semiconductor package, said first hole extending into said pillar along a longitudinal direction of said pillar and opening away from the semiconductor package and the base plate, the radius of each disk-shaped fin being larger than half the width of said package and smaller than half the width of said semiconductor package plus the predetermined distance.

8. A radiator bondable to a semiconductor package containing a semiconductor chip, the semiconductor package having a width, having external leads extending a predetermined distance from the semiconductor package in the direction of the width, and being mounted on a base plate, comprising:

a pillar having a plurality of fins extending from said pillar, a bottom end of said pillar being bondable to said semiconductor package, a top end of said pillar having a first hole for insertion of a probe for testing said semiconductor package, the first hole extending into said pillar along a longitudinal direction of said pillar and opening away from the base plate, said fins having a diameter greater than half of the width of the semiconductor package and less than half of the width of the semiconductor package plus the predetermined distance.

9. A radiator, bondable to an associated semiconductor package containing a semiconductor chip, for dissipating heat from said package and for facilitating mounting of said associated semiconductor package on a predetermined mounting position of a base plate, said package having first and second opposite, main surfaces defining the major lateral width dimension of the package and having lead terminals extending from said first main surface, comprising:

a generally elongated pillar defining a central, longitudinal axis and having a bottom end and a top end, said bottom end being bondable to said second main surface of said package;

plural heat radiating fins formed integrally with said pillar and extending laterally outwardly from said pillar relative to said central longitudinal axis at longitudinally spaced positions along said axis, the lateral outward dimension of said fins being greater than the major lateral width dimension of said package; and a hole extending longitudinally and interiorly of said pillar from said upper end thereof and defining an interior engagement surface of said pillar which is accessible for engaging said pillar and transporting said associated pillar and semiconductor package to the predetermined mounting position on the base plate.

10. A radiator as recited in claim 9, wherein:
said hole is of a predetermined longitudinal length, sufficiently less than the longitudinal length of said pillar so as not to materially affect the heat dissipation capability of said radiator.

11. Plural radiators, each as recited in claim 9, bondable to respectively associated, plural semiconductor packages of at least two different types, wherein:
said longitudinally extending holes of said plural radiators have longitudinal lengths of at least two, different and predetermined amounts, respectively selected to correspond to and thereby identify, by the respective longitudinal lengths thereof, said two different types of said semiconductor packages respectively bonded thereto.

12. A radiator as recited in claim 9, wherein said semiconductor package further comprises a mounting stud of predetermined axial length secured to and extending from a central position of said main surface of said semiconductor package, and wherein there is further provided:

a second hole extending longitudinally into said pillar from said lower end thereof by a distance corresponding to the axial length of said stud, for receiving said stud in telescoping relationship in the assembled relationship of said radiator and said associated semiconductor package.

* * * * *